United States Patent
Schweitzer, III et al.

(10) Patent No.: US 11,137,436 B2
(45) Date of Patent: Oct. 5, 2021

(54) SECURE TRAVELING WAVE DISTANCE PROTECTION IN AN ELECTRIC POWER DELIVERY SYSTEM

(71) Applicant: Schweitzer Engineering Laboratories, Inc., Pullman, WA (US)

(72) Inventors: Edmund O. Schweitzer, III, Pullman, WA (US); Bogdan Z. Kasztenny, Markham (CA)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 261 days.

(21) Appl. No.: 16/137,350

(22) Filed: Sep. 20, 2018

(65) Prior Publication Data

US 2019/0094292 A1    Mar. 28, 2019

Related U.S. Application Data

(60) Provisional application No. 62/562,276, filed on Sep. 22, 2017.

(51) Int. Cl.
    *G01R 31/11*      (2006.01)
    *H02H 7/26*      (2006.01)
    (Continued)

(52) U.S. Cl.
    CPC ............ *G01R 31/11* (2013.01); *G01R 31/085* (2013.01); *H02H 1/0007* (2013.01);
    (Continued)

(58) Field of Classification Search
    CPC ........ G01R 3/11; G01R 31/11; G01R 31/085; G01R 19/1513; H02H 7/265; H02H 1/007; H02H 1/0092
    See application file for complete search history.

(56) References Cited

U.S. PATENT DOCUMENTS

| 5,272,439 A | 12/1993 | Mashikian |
| 6,369,996 B1 | 4/2002 | Bo |

(Continued)

FOREIGN PATENT DOCUMENTS

| CN | 103884963 | 6/2014 |
| CN | 104730419 | 6/2015 |

(Continued)

OTHER PUBLICATIONS

PCT/US2018/052480 Patent Cooperation Treaty, International Search Report and Written Opinion of the International Searching Authority, dated Nov. 26, 2018.

(Continued)

*Primary Examiner* — Nguyen Tran
*Assistant Examiner* — Trinh Q Dang
(74) *Attorney, Agent, or Firm* — Jared L. Cherry; Richard M. Edge

(57) ABSTRACT

The present disclosure pertains to systems and methods for monitoring traveling waves in an electric power system. In various embodiments, a data acquisition subsystem may acquire electric power system signals. A traveling wave detection subsystem may detect two or more traveling waves based on the electric power system signals and determine a location of an event triggering the traveling waves. A traveling wave security subsystem may selectively generate a restraining signal based on the location of the event as within a blocking zone. A protection action subsystem may implement a protective action when the location is outside of a blocking zone. In various embodiments, a protective action will not be implemented for traveling waves launched from known locations of switching devices operating normally. Further, protective actions may be restrained if a magnitude of a traveling wave differs from an expected value based on a pre-fault voltage.

18 Claims, 7 Drawing Sheets

(51) Int. Cl.
  *H02H 1/00*   (2006.01)
  *G01R 31/08*  (2020.01)
  *G01R 19/25*  (2006.01)

(52) U.S. Cl.
  CPC ......... *H02H 7/265* (2013.01); *G01R 19/2513* (2013.01); *H02H 1/0092* (2013.01)

(56) References Cited

U.S. PATENT DOCUMENTS

| | | |
|---|---|---|
| 6,798,211 B1 | 9/2004 | Rockwell |
| 2006/0012374 A1 | 1/2006 | Kojovic |
| 2007/0069820 A1* | 3/2007 | Hayata ................... H03F 1/565 330/298 |
| 2009/0230974 A1 | 9/2009 | Kojovic |
| 2010/0217548 A1 | 8/2010 | Faybisovich |
| 2015/0081234 A1 | 3/2015 | Schweitzer, III et al. |
| 2015/0081235 A1 | 3/2015 | Schweitzer |
| 2016/0077149 A1 | 3/2016 | Schweitzer, III |
| 2016/0241336 A1 | 8/2016 | Kasztenny |
| 2017/0012424 A1 | 1/2017 | Schweitzer, III et al. |
| 2017/0082675 A1 | 3/2017 | Schweitzer, III et al. |
| 2017/0110875 A1 | 4/2017 | Schweitzer, III et al. |
| 2017/0195362 A1* | 7/2017 | Schweitzer, III ... G06F 11/0709 |
| 2018/0145665 A1* | 5/2018 | Hurwitz ................ H03K 4/502 |

FOREIGN PATENT DOCUMENTS

| | | |
|---|---|---|
| CN | 103364604 | 6/2016 |
| CN | 103604991 | 3/2017 |
| WO | 2016139613 | 9/2016 |
| WO | 2016177407 | 11/2016 |

OTHER PUBLICATIONS

Edmund O. Schweitzer, III, Armando Guzman, Mangapathirao V. Mynam, Veselin Skendzic, Bogdan Kasztenny, Stephen Marx; Locating Faults by the Traveling Waves they Launch, 2014 Texas A&M Conference for Protective Relay Engineers, Feb. 10, 2014.

Yadong Liu, Gehao Sheng, Zhimin He, Xiuchen Jiang, A Traveling Wave Fault Location Method for Earth Faults Based on Mode Propagation Time Delays of Multi-Measuring Points, Przeglad Elektrotechniczny (Electrical Review), Jan. 2012.

PCT/US2018/052204 Patent Cooperation Treaty, International Search Report and Written Opinion of the International Searching Authority, dated Dec. 21, 2018.

PCT/US2018/052207 Patent Cooperation Treaty, International Search Report and Written Opinion of the International Searching Authority, dated Dec. 10, 2018.

PCT/US2018/052196 Patent Cooperation Treaty, International Search Report and Written Opinion of the International Searching Authority, dated Dec. 21, 2018.

\* cited by examiner

SECURE TRAVELING WAVE DISTANCE PROTECTION IN AN ELECTRIC POWER DELIVERY SYSTEM

RELATED APPLICATION

The present application claims priority under 35 U.S.C. § 119 to U.S. Provisional Patent Application No. 62/562,276, titled SECURE TRAVELING WAVE DISTANCE PROTECTION IN AN ELECTRIC POWER DELIVERY SYSTEM filed Sep. 22, 2017, which is incorporated by reference.

TECHNICAL FIELD

This disclosure relates to distance protection using traveling waves in an electric power delivery system. More specifically, but not exclusively, this disclosure relates to providing security for in-zone switching events using a concept of a multi-zone protection scheme.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Traveling waves ("TWs") are surges of electricity resulting from sudden changes in voltage that propagate at a speed near the speed of light along overhead power lines. When launched by a line fault, these TWs carry information about the fault location and type. Furthermore, this information arrives at the line terminals within 1 to 2 ms depending on the line length and fault location. Relative arrival times and polarities of TWs allow for location of faults with accuracy on the order of a single tower span, as well as to protect the line with a permissive over-reaching transfer trip (POTT) scheme using TW-based directional elements (TW32) and with a TW-based line current differential scheme (TW87). These TW-based line protections utilize a communication channel, which may be either a standard pilot channel for the POTT scheme or a direct fiber-optic channel for the TW87 scheme; and may use current TWs, taking advantage of the adequate frequency response of current measurement devices. In various embodiments, line protection systems consistent with the present disclosure may operate on the order of 1 to 2 ms without a communication channel.

Figure 1:
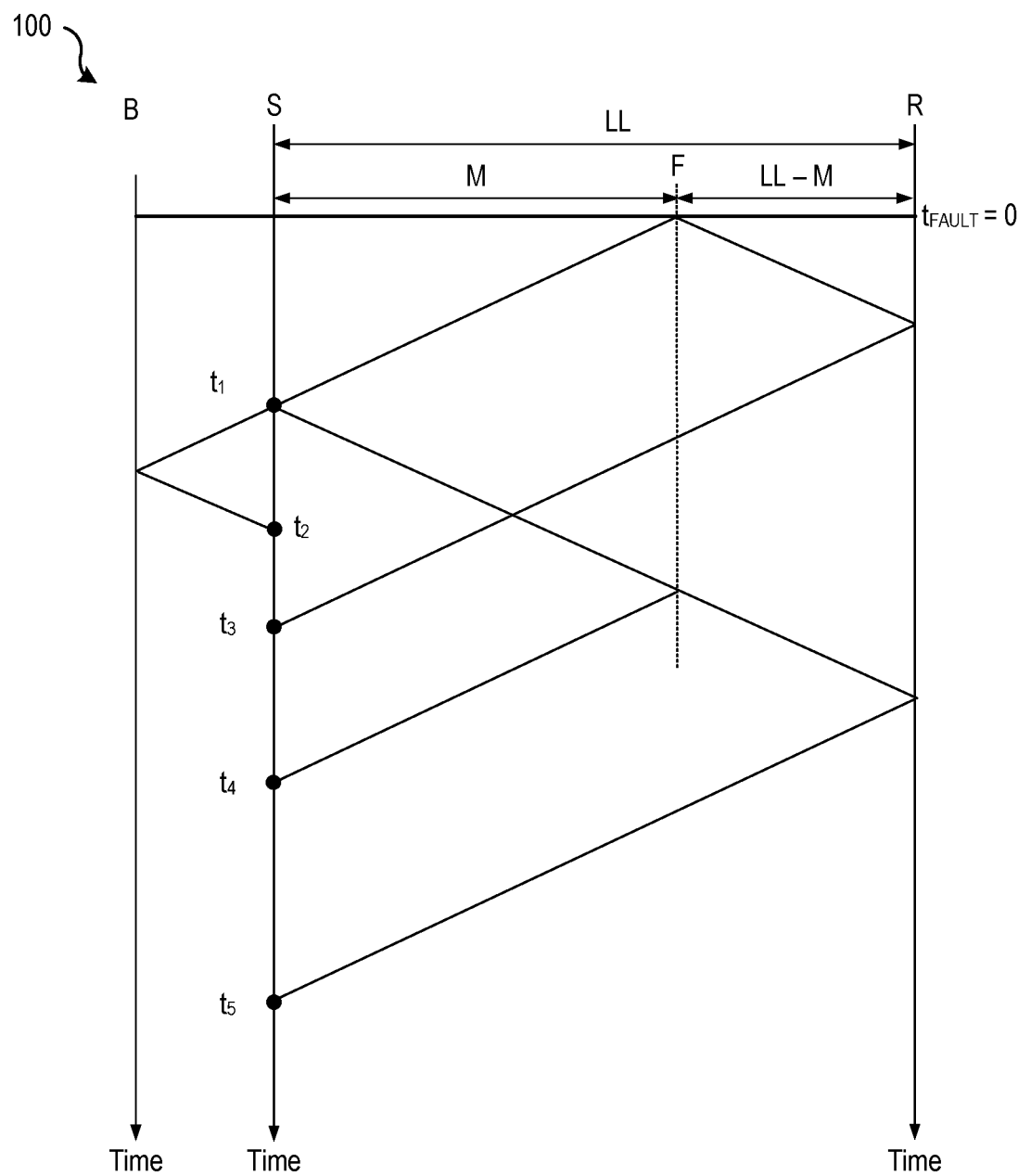
FIG. 1 shows a Bewley diagram for a fault at a location on an electric power system line consistent with embodiments of the present disclosure.

FIG. 1 shows a Bewley diagram for a fault at location F on an electric power system line of length LL consistent with embodiments of the present disclosure. The fault is M (km or mi) away from the local terminal (S) and LL–M (km or mi) away from the remote terminal (R). Consider another terminal (B) behind the local terminal. A TW line propagation time (TWLPT) is the time it takes for a TW to travel from one line terminal to the opposite terminal.

A TW launched at the fault point (F) arrives at the local terminal (S) at $t_1$. Part of the TW reflects, travels back toward the fault, reflects back from the fault, and then returns to the local terminal (S) at $t_4$. During the $t_4-t_1$ time interval, the TW travels a distance of 2·M. We write the distance-velocity-time equation as follows:

$$2 \cdot M = (t_4 - t_1) \cdot PV \qquad \text{Eq. 1}$$

where the propagation velocity, PV, is:

$$PV = \frac{LL}{TWLPT} \qquad \text{Eq. 2}$$

Substituting Eq. 2 into Eq. 1 and solving for M yields Eq. 3, which may be used to calculate the distance-to-fault value:

$$M = \frac{LL}{2} \frac{t_4 - t_1}{TWLPT} \qquad \text{Eq. 3}$$

Introducing a per-unit reach, TW21M, we use Eq. 3 to express an operating equation for the TW21 underreaching distance element:

$$\frac{t_F - t_1}{2 \cdot TWLPT} < TW21M \qquad \text{Eq. 4}$$

where:
$t_1$ is the arrival time of the very first TW, and
$t_F$ is the arrival time of the first return from the fault ($t_4$ in FIG. 1).

To emphasize reliance of the TW21 on the measurement of time, we rewrite the TW21 operating equation as follows:

$$(t_F - t_1) < 2 \cdot TW21M \cdot TWLPT \qquad \text{Eq. 5}$$

The left-hand side of Eq. 5 is the relay measurement. Responding only to TW arrival times, this measurement is not affected by CT and PT ratio errors, transients, and signal distortions in the lower (kHz) frequency band. The TW21 element does not use line impedance data when calculating the operating signal in Eq. 5, and therefore the operating signal is not affected by the finite accuracy of such line data.

The right-hand side of Eq. 5 is a threshold fixed for any given application—twice the product of the line length expressed in the TW line propagation time, TWLPT, and the user-preferred per-unit reach setting, TW21M. When used in the single-ended TW-based fault locator, a fault location may be determined with the accuracy of 1 or 2 tower spans. Because of this high accuracy, the TW21M reach may be set assertively, such as at 0.95 per unit, to cover 95 percent of the line length without a communication channel (compared with a typical reach setting of 80 percent for an impedance-based distance element).

Figure 2:
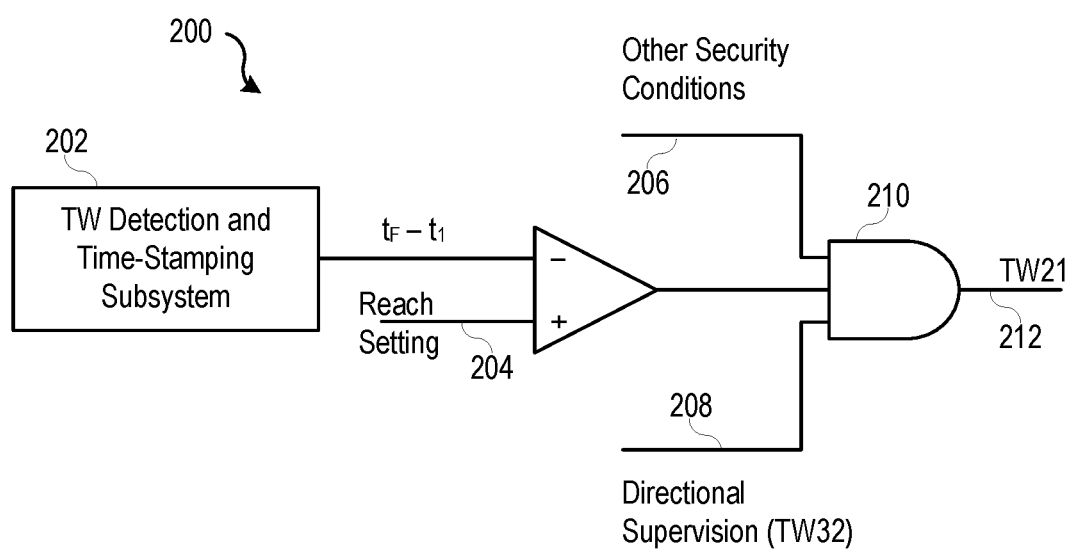
FIG. 2 illustrates a simplified logic diagram of a traveling wave distance element consistent with embodiments of the present disclosure.

FIG. 2 illustrates a simplified logic diagram of a traveling wave distance element 200 consistent with embodiments of the present disclosure. A difference between the arrival time of the first return from the fault ($t_F$) and the arrival time of the first TW associated with the fault ($t_1$) at the terminal ($t_F$–$t_1$) is determined by a TW detection and time-stamping subsystem 202. The difference is representative of a distance to the fault as per Eq. 3. The difference is compared against a reach setting 204. The reach setting 204 may be a setting related to the zone of protection of this particular protection element, such as given by the right-hand side of Eq. 5. If the difference is within the zone of protection (i.e., is less than the reach setting 204), then an output 212 of traveling wave distance element 200 may be asserted. The assertion of the output 212 may be used to apply a protective action such as, for example, tripping to open a line.

According to the illustrated embodiment, the traveling wave distance element 200 may be made more secure by requiring other conditions to exist or be determined before the output 212 is asserted. As illustrated, a directional supervision (TW32) input 208 input may indicate that the fault is in a direction of the TW21 element, typically forward. Furthermore, other security conditions 206 may be required in addition to the directional supervision 208 for the traveling wave distance element 200 to solve challenges related to protection security as described below.

Several challenges remain in a successful implementation of the TW21 element. For example, the distance-to-fault calculation shown in Eq. 3 works well if the element correctly identifies the first return from the fault; however, if another TW is mistaken for the first return from the fault, the calculation of the distance-to-fault calculation will be inaccurate. As illustrated in FIG. 1, the first TW that arrived at $t_1$ continued toward Terminal B, reflected from the terminal, and then returned to the local terminal (S) at time $t_2$. If a TW-based system mistook $t_2$ for the first return from the fault, the distance-to-fault calculation result would be incorrect. Similarly, the first TW that arrived at the remote terminal (R) reflects from Terminal R and returns to the local terminal (S), propagating through the fault point (F). This TW arrives at the local terminal at $t_3$. If the TW21 algorithm mistook $t_3$ for the first return from the fault, the distance-to-fault calculation result would also be incorrect.

Any event that causes an abrupt change in voltage, not only a fault, launches traveling waves. A practical TW21 element design must distinguish events associated with typical operation of equipment in a power system (e.g., in-zone switching events) and faults. The in-zone switching events include capacitor by-pass and reinsertion on series-compensated lines and switching line-side shunt reactors in and out of service. In various embodiments consistent with the present disclosure, traveling waves may be analyzed by various systems and methods to determine the location of an event that triggers traveling waves. Further, the traveling waves may be analyzed to determine whether a control action (e.g., opening a breaker) should be implemented based upon the location of the event that triggers traveling waves.

When a TW21 element is ready to operate, a location from which the TWs were launched has been already determined. As a part of a TW21 system's logic, the element calculates the location in a manner consistent with a single-ended TW fault locator. The element then may use this calculated event location to block for locations close to in-line series capacitors or line-side reactors, in order to ride-through TWs launched by switching these capacitors or reactors in or out.

Figure 3A:
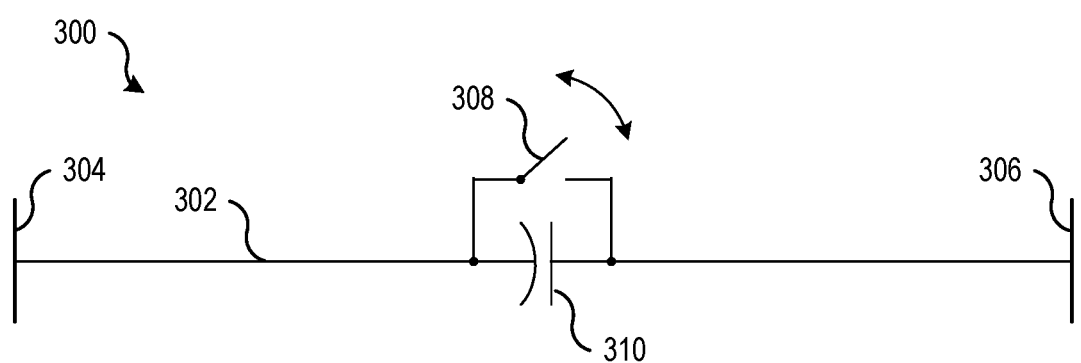
FIG. 3A illustrates a simplified one-line diagram of a portion of an electric power delivery system that includes a capacitor and a bypass switching device, which are installed at a known location on the power line, consistent with embodiments of the present disclosure.

FIG. 3A illustrates a simplified one-line diagram of a portion of an electric power delivery system 300 that includes a capacitor 310 and a bypass switching device 308, which are installed at a known location on the power line 302, consistent with embodiments of the present disclosure. The switching device 308 may be embodied as an in-line series capacitor or line-side reactor, for example. Switch 308 may be actuated to bypass capacitor 310. Capacitor 310 may be bypassed by closing switch 308 for maintenance or other reasons. Other types of equipment in an electric power system may also create traveling waves during typical operation. For example, a multi-tap transformer may create traveling waves when tap changes are performed.

Closing or opening switching device 308 may trigger traveling waves toward buses 304 and 306. Switching capacitor 310 in out of service is part of the typical operation of system 300, and as such, should not trigger protective actions; however, such switching may generate traveling waves similar to traveling waves indicative of a fault and that may typically cause a traveling wave protection system to implement a protective action.

In various embodiments consistent with the present disclosure, a TW21 system may restrain protective actions triggered by traveling waves originating in proximity to the location of capacitor 310 and switch 308. Such a system may avoid protective actions associated with typical operation of system 300, without communication with switch 308.

Figure 3B:
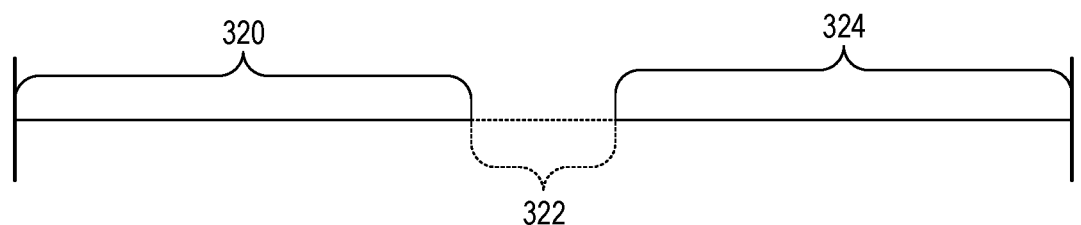
FIG. 3B illustrates a multi-zone protection scheme consistent with embodiments of the present disclosure.

FIG. 3B illustrates a multi-zone protection scheme consistent with embodiments of the present disclosure. Traveling waves detected in a first section 320 and a third section 324 may be processed by a traveling wave protection system as caused by a fault. In other words, if a traveling wave protection system determines that traveling waves originated from an event, such as a fault, in either the first section 320 or the third section 324, the traveling wave protection system may implement a protective action. If traveling waves are in the second section 322, however, the traveling wave protection system may process them as caused by a switching event and may restrain protective actions. Accordingly, the second section 322 may also be referred to as a blocking section or a restraining section.

As may be appreciated, restraining protective actions based on traveling waves associated with events in the second section 322 may avoid protective actions associated with the actuation of switch 308. Avoiding such actions may increase security and reliability of system 300 by avoiding protective actions associated with the typical operation (e.g., actuation of breaker 308) of system 300. In various embodiments, the size of the second section 322 may be selected to account for a margin of error associated with a traveling wave protection system or other factors. Thanks to the very high accuracy of fault locating, the blocking region can be very small, such as in the order of 1 km on each side of the switching point, thus making the non-blocked sections large allowing protection of the majority of the line length.

Figure 4:
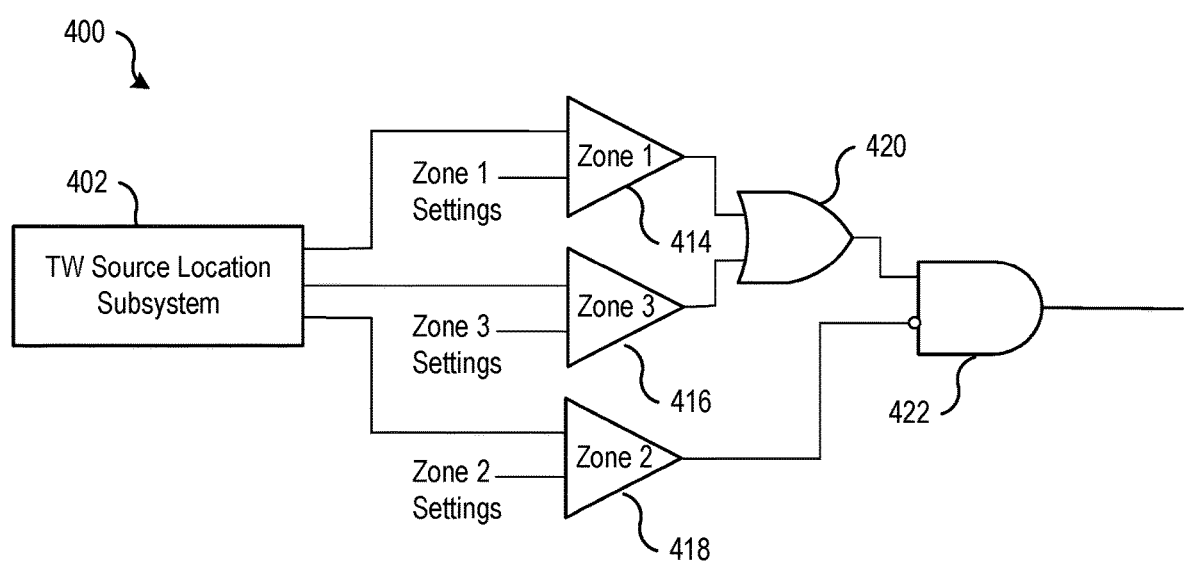
FIG. 4 illustrates a simplified logic diagram of a system that may be used to establish a multi-zone protection scheme consistent with embodiments of the present disclosure.

FIG. 4 illustrates a simplified logic diagram of a system 400 that may be used to establish a multi-zone protection scheme consistent with embodiments of the present disclosure. In the illustrated embodiment, a traveling wave source location subsystem 402 may determine a location of traveling waves. As described above, traveling waves may be created by faults and by typical operation of an electric power system. System 400 may restrain protective actions associated with events that generate traveling waves and that occur in a particular zone.

In the illustrated embodiment, system 400 disables a TW21 output 412 if an event occurs in either zone 1 or zone 3, but not in zone 2. Comparators 414, 416, and 418 for each of Zones 1, 2, and 3 may receive an output from the TW source location subsystem 402 and zone-specific settings. The zone-specific settings may specify a range corresponding to a particular zone. If the location of an event giving rise to traveling waves is within a particular zone, the output of the associated comparator 414, 416, or 418 may be asserted. The outputs of comparators 414 and 416 may be inputs to OR gate 420. Accordingly, if an event giving rise to traveling waves occurs in either Zone 1 or Zone 2, the output of OR gate 420 is asserted. The output of OR gate 420 and the negated output of comparator 418 (i.e., the event did not occur in Zone 2) may be inputs to AND gate 422. As may be appreciated, negating the output of comparator 418 ensures that if the event occurs in Zone 2, the output of AND gate 422 will not be asserted. In various embodiments, additional logic may be utilized to create multiple restraining or blocking zones and different configurations of such zones.

Additional inputs to AND gate 410 may also be used in various embodiments to selectively enable an output 412 associated with a TW21 signal. For example, other security conditions 406 may also be required. In one specific embodiments, such other security conditions may include confirmation that the polarity and magnitude of the first incident TW is consistent with the instantaneous pre-fault voltage at the fault location, as described in greater detail in FIG. 5. In the embodiment illustrated in FIG. 4, a directional supervision element (TW32) 408 may also serve as an input to AND gate 410. In one embodiment, the directional supervision signal 408 may be asserted when the fault is in the forward direction, as opposed to the reverse direction.

Figure 5:
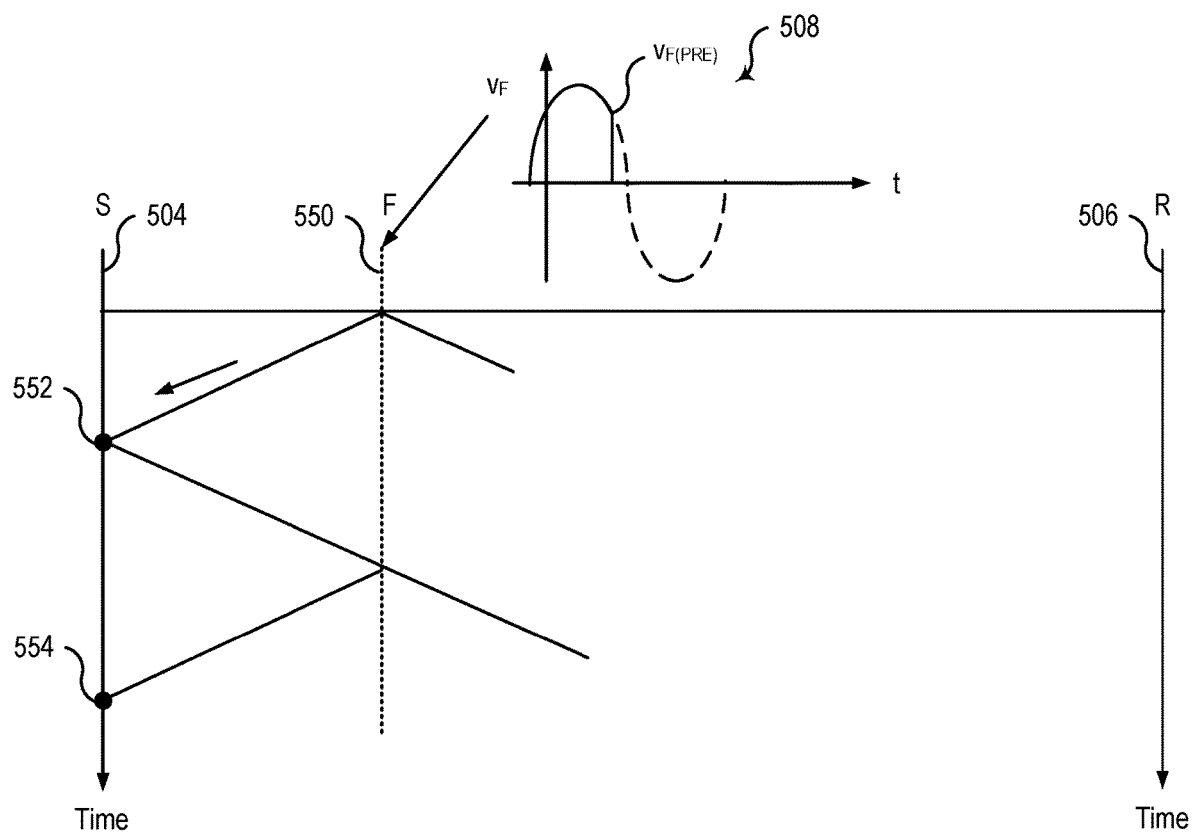
FIG. 5 illustrates a Bewley diagram, where an event in an electric power system launches traveling waves toward buses S and R, and a system confirms that the first incident TW is consistent with a calculated pre-fault voltage at a location of the event consistent with embodiments of the present disclosure.

FIG. 5 illustrates a lattice diagram, where an event in an electric power system launches traveling waves toward buses S 504 and R 506, and a system confirms that the first incident TW is consistent with a calculated pre-fault voltage at a location 550 of the event consistent with embodiments of the present disclosure. A single-ended traveling wave fault detector in electrical communication with bus S 504 may determine a location of the fault using incident wave 552 and reflection 554, along with the speed of propagation of the traveling wave. The fault detector may also determine the pre-fault voltage at the fault location 550. In some embodiments, the pre-fault voltage at the fault location 550 can be accurately approximated as a weighted average of the instantaneous voltages at both ends of the line. the weighting coefficients are the per unit fault location for the local voltage, and 1—per unit fault location for the remote voltage. Alternatively, the pre-fault voltage can be approximated as a local voltage compensated for the voltage drops from the local current across the line impedance between the bus S and the fault location 550.

The polarity and magnitude of the first incident traveling wave 552 may be analyzed to ensure that it is consistent with the pre-fault voltage at the fault location 550. In particular, a fault at a positive pre-fault voltage depresses the voltage, and therefore launches negative voltage and current traveling waves. The incident traveling waves for a fault at a positive pre-fault voltage should therefore be negative. As illustrated in the plot 508 of the voltage at the location of the fault ($V_F$), the voltage immediately prior to the fault ($V_{F\,(PRE)}$), and accordingly, the traveling wave launched toward bus S 504 would be negative. The expected voltage after the fault is indicated using a dashed line. A traveling wave detection system consistent with the present disclosure may confirm that polarity of a received traveling wave matches the polarity expected based on the voltage. The comparison of the received and expected polarity may be used as one security condition necessary to enable a protective action in various embodiments consistent with the present disclosure.

The pre-fault voltage and the line characteristic impedance also establish a maximum amplitude of a traveling wave. A change in voltage by $\Delta V$ generates an incident current traveling wave of $\Delta V/Z_c$ where $Z_c$ is the known line characteristic impedance. For example, a sudden change in voltage by 40 kV on a 350-ohm line would generate a current TW of about $40,000/350=114$ A primary. This wave may be attenuated before it arrives at the terminal, but it may be still expected to be in the range of 100 A. If the incident wave is measured to be considerably above 100 A or considerably below 100 A, the protection action may be blocked. A traveling wave detection system consistent with the present disclosure may confirm that the magnitude of a traveling wave is less than the maximum amplitude of a traveling wave in various embodiments as a security condition necessary to enable a protective action.

Figure 6:
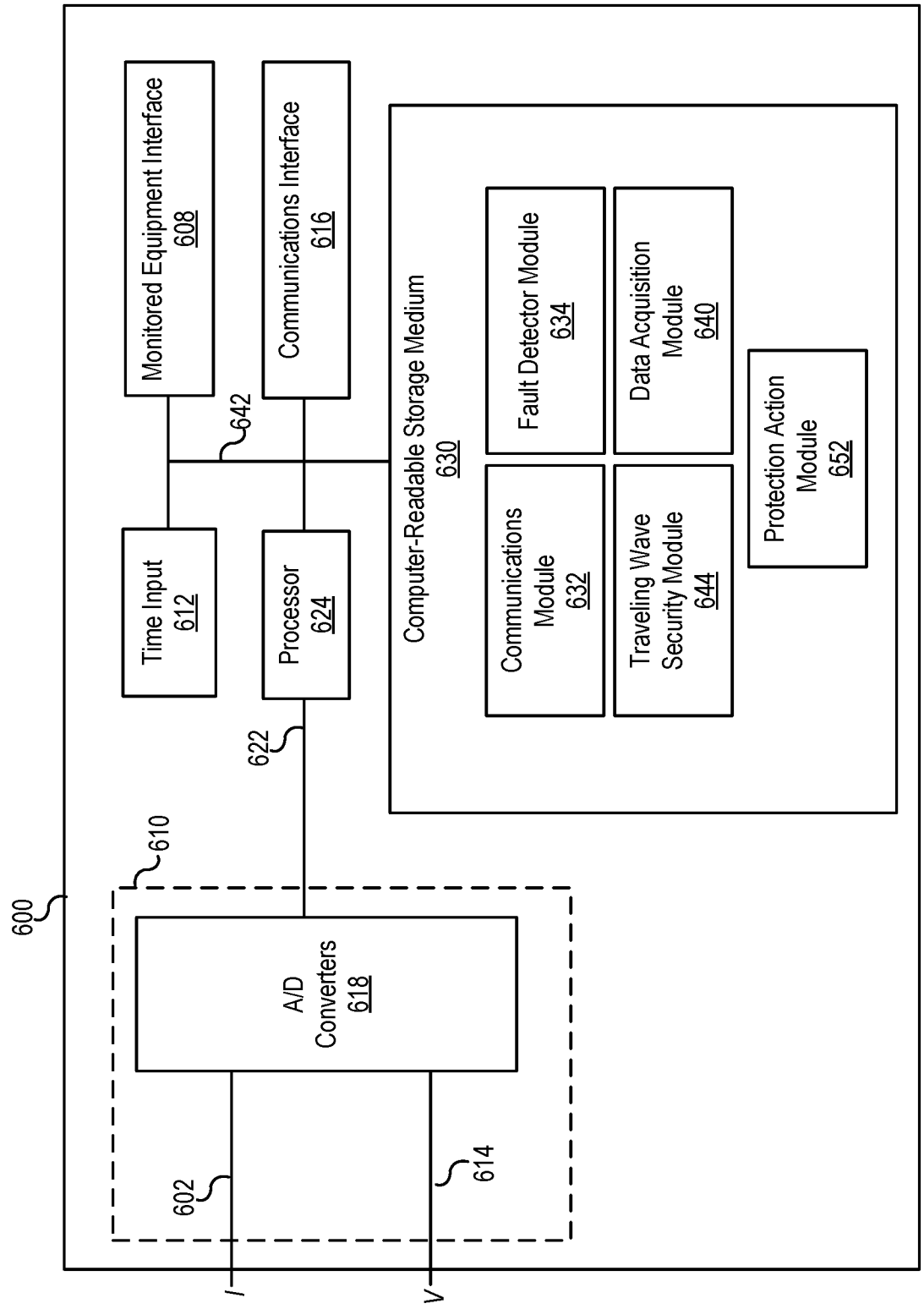
FIG. 6 illustrates a functional block diagram of a system for detecting and locating faults using distortions in traveling waves consistent with embodiments of the present disclosure.

FIG. 6 illustrates a functional block diagram of a system 600 for detecting and locating faults using distortions in traveling waves consistent with embodiments of the present disclosure. In certain embodiments, the system 600 may comprise an IED system to, among other things, obtain and calculate traveling wave signals and analyze distortions in traveling waves. Traveling waves may be measured by current transformers, which may be installed at the ends of transmission lines in substations. Current transformers typically have enough fidelity to measure current traveling waves with adequate accuracy for practical protection and fault locating applications. However, a current transformer measures the current at the point of its installation at the line terminal which is always a discontinuity in the characteristic impedance, and therefore it measures the sum of the incident and reflected current traveling waves. It does not measure the incident wave separately and it does not allow separating of the waves into incident, reflected, and transmitted waves.

The voltage and current traveling waves are linked with the characteristic impedance of the line, and according, may be separated into the incident, reflected and transmitted components. This separation may be performed using Eq. 6 for voltage traveling waves or Eq. 7 for current traveling waves.

$$v_{incident} = \frac{V_{TW} - i_{TW}Z_c}{2} \qquad \text{Eq. 6}$$
$$v_{reflected} = \frac{V_{TW} + i_{TW}Z_c}{2}$$

$$i_{incident} = \frac{V_{TW}/Z_c - i_{TW}}{2} \qquad \text{Eq. 7}$$
$$i_{reflected} = \frac{V_{TW}/Z_c + i_{TW}}{2}$$

Accurate measurements of both the total current traveling wave ($i_{TW}$) and the voltage traveling wave ($V_{TW}$) are needed to separate incident, reflected, and transmitted components. Current transformers may be used in some embodiments because they provide sufficiently accurate current traveling wave measurements. High-fidelity voltage measurements may be obtained in various embodiments using the systems and methods disclosed in U.S. patent application Ser. No. 16/137,186, titled HIGH-FIDELITY VOLTAGE MEASUREMENT USING A CAPACITANCE-COUPLED VOLTAGE TRANSFORMER, and filed on Sep. 20, 2018, which is incorporated herein by reference.

Wave separation into the incident, reflected, and transmitted traveling waves may allow better utilization of the traveling wave information as compared with using just traveling wave measurements from current transformers, which are the sums of the incident and reflected waves.

System 600 may be implemented using hardware, software, firmware, and/or any combination thereof. In some embodiments, system 600 may be embodied as an IED, while in other embodiments, certain components or functions described herein may be associated with other devices or performed by other devices. The specifically illustrated configuration is merely representative of one embodiment consistent with the present disclosure.

System 600 includes a communications interface 616 to communicate with devices and/or IEDs. In certain embodiments, the communications interface 616 may facilitate direct communication with other IEDs or communicate with systems over a communications network. System 600 may further include a time input 612, which may be used to receive a time signal (e.g., a common time reference) allowing system 600 to apply a time-stamp to the acquired samples. In certain embodiments, a common time reference may be received via communications interface 616, and accordingly, a separate time input may not be required for time-stamping and/or synchronization operations. One such embodiment may employ the IEEE 1588 protocol. A monitored equipment interface 608 may receive status information from, and issue control instructions to, a piece of monitored equipment (such as a circuit breaker, conductor, transformer, or the like).

Processor 624 processes communications received via communications interface 616, time input 612, and/or monitored equipment interface 608. Processor 624 may operate using any number of processing rates and architectures. Processor 624 may perform various algorithms and calculations described herein. Processor 624 may be embodied as a general-purpose integrated circuit, an application-specific integrated circuit, a field-programmable gate array, and/or any other suitable programmable logic device.

In certain embodiments, system 600 may include a sensor component 610. In the illustrated embodiment, sensor component 610 may receive high-fidelity current measurements 602 and/or high-fidelity voltage measurements 614. The sensor component 610 may use comprise A/D converters 618 that sample and/or digitize filtered waveforms to form corresponding digitized current and voltage signals provided to data bus 622. High-fidelity current measurements 602 and/or high-fidelity voltage measurements 614 may include separate signals from each phase of a three-phase electric power system. A/D converters 618 may be connected to processor 624 by way of data bus 622, through which digitized representations of current and voltage signals may be transmitted to processor 624.

A non-transitory computer-readable storage medium 630 may be the repository of various software modules that perform the methods, calculations, and determinations described herein. A data bus 642 may link monitored equipment interface 608, time input 612, communications interface 616, and computer-readable storage medium 630 to processor 624.

Communications module 632 may allow system 600 to communicate with any of a variety of external devices via communications interface 616. Communications module 632 may communicate using a variety of data communication protocols.

Data acquisition module 640 may collect data samples, such as current and voltage measurements associated with traveling waves. The data samples may be associated with a timestamp and made available for retrieval and/or transmission to a remote IED via communications interface 616. Traveling waves may be measured and recorded in real-time, since they are transient signals that dissipate rapidly in an electric power delivery system. Data acquisition module 640 may operate in conjunction with fault detector module 634. Data acquisition module 640 may control recording of data used by the fault detector module 634. According to one embodiment, data acquisition module 640 may selectively store and retrieve data and may make the data available for further processing. Such processing may include processing by fault detector module 634, which may identify distortions in traveling waves.

Traveling wave identification module 644 may compare distortions of traveling waves. As described and illustrated herein, traveling wave distortions may be used to determine the origin or reflection of traveling waves. Traveling waves with similar distortions may be determined to have similar origins or reflections. Traveling wave identification module 644 may identify traveling waves based on detected distortions. The fault detector module 634 may determine a fault according to several traveling wave protection algorithms using the identifications of the traveling waves according to several embodiments herein.

Traveling wave security module 644 may calculate a fault location using traveling wave information, and may apply security considerations to restrain protective actions under certain conditions. The traveling wave security module 644 may block the traveling wave distance fault detection when the fault location is determined to be in a restraining or blocking zone. The restraining or blocking zone may correspond with a location of a switching device capable of launching traveling waves from the location of the switching device. In some embodiments, the traveling wave security module 644 may calculate the pre-fault voltage at the fault location and block the traveling wave distance element when the magnitude or polarity of the observed traveling wave do not correspond with the calculated pre-fault voltage at the fault location. The traveling wave security module 644 may selectively restrain protective actions implemented by protection action module 652.

Figure 7:
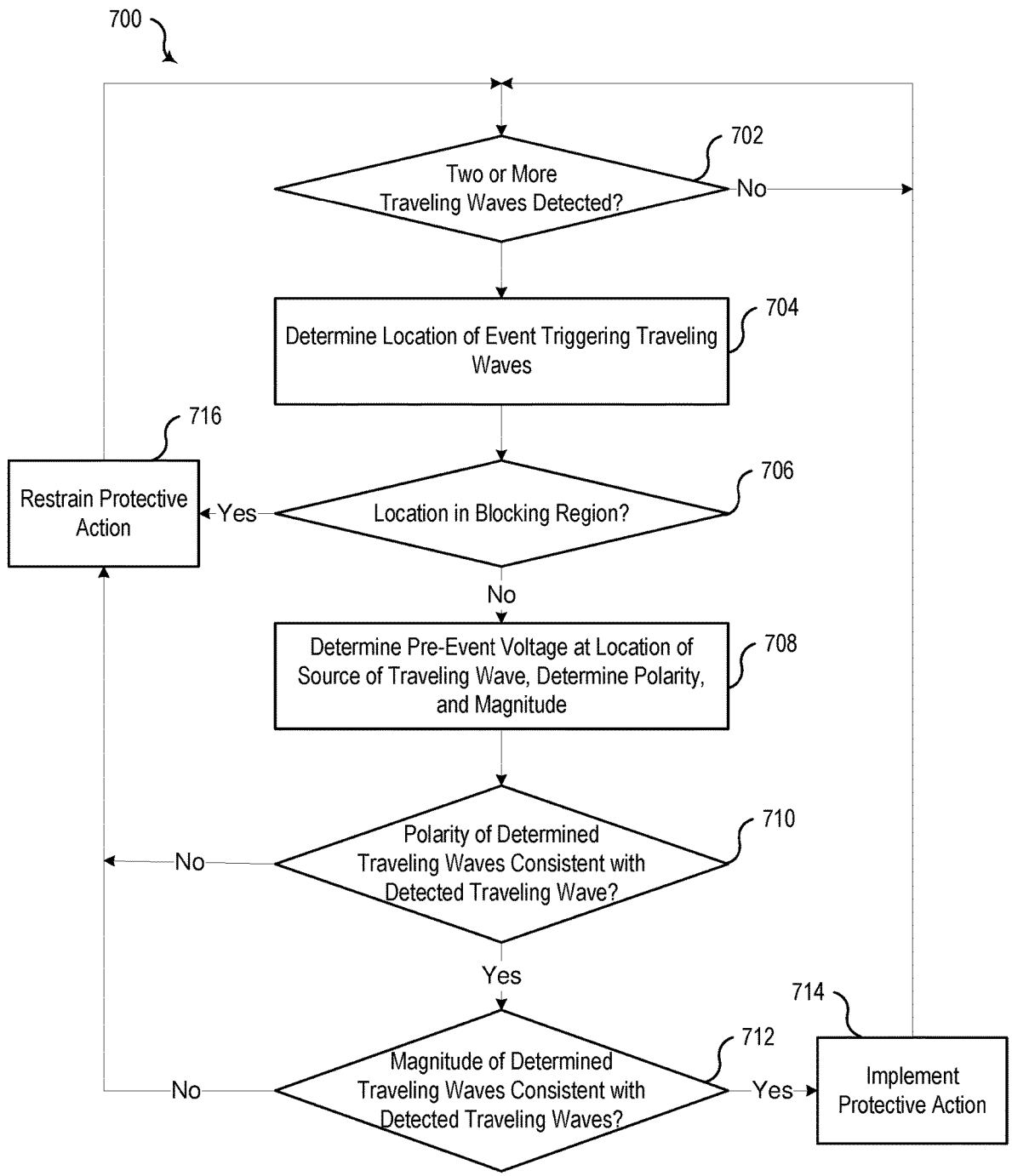
FIG. 7 illustrates a flow chart of a method for detecting and locating faults using traveling waves and selectively enabling protective actions consistent with embodiments of the present disclosure.

FIG. 7 illustrates a flow chart of a method 700 for detecting and locating faults using traveling waves and selectively enabling protective actions consistent with embodiments of the present disclosure. At 702, method 700 may wait until two or more traveling waves are detected. Upon detection, a location of an event triggering the traveling waves may be determined at 704. In various embodiments, the location of source of the traveling waves may be determined using a single-ended traveling wave system detection system.

At 706, method 700 may determine whether the source of the traveling wave is located in a blocking region. If the location is in a blocking region, protective action based on the traveling wave may be restrained at 716. As described in connection with FIG. 3, blocking regions may be associated with equipment that may launch traveling waves during normal operation of the electric power system. In various embodiments, a plurality of blocking zones may be established.

Returning to a discussion of FIG. 7, at 708, method 700 may determine the pre-event voltage at the location of the source of the traveling wave. Based on the pre-event voltage, the polarity and magnitude of an expected traveling wave may be determined. As discussed in connection with FIG. 5, the pre-event voltage determines the polarity of the resulting traveling wave. A fault at a positive pre-fault voltage depresses the voltage, and therefore launches negative voltage and current traveling waves. The incident traveling waves for a fault at a positive pre-fault voltage should therefore be negative. The polarity of the determined traveling wave may be compared to the detected traveling wave for consistency at 710. If the polarity is inconsistent, method 700 may restrain a protective action at 716.

At 712, the magnitude of the determined traveling wave may be compared to the detected traveling wave for consistency. If the comparison is inconsistent, method 700 may restrain a protective action at 716. If the magnitude is consistent, method 700 may implement a protective action at 714. In various embodiments, protective actions may comprise actuating a breaker, energizing or de-energizing a portion of an electric power system, etc.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system to monitor traveling waves in an electric power delivery system, comprising:
   a data acquisition subsystem to acquire signals from the electric power delivery system at a first terminal of the electric power delivery system;
   a traveling wave detection subsystem to:
      analyze the signals from the electric power delivery system to identify at least two traveling waves; and
      determine an event location of an event triggering the identified traveling waves;
   a traveling wave security subsystem in communication with the traveling wave detection subsystem to:
      assess a security measure based on the event location; and
      selectively generate a restraining signal based on the security measure; and
   a protection action subsystem in communication with the traveling wave detection subsystem and the traveling wave security subsystem to implement a protective action based on:
      detection of the traveling waves, and
      absence of the restraining signal.

2. The system of claim 1, wherein the security measure comprises a multi-zone protection scheme comprising at least one blocking zone.

3. The system of claim 1, wherein the traveling wave security subsystem further:
   determines a pre-event voltage at the location of the event;
   determines an expected polarity of an incident traveling wave based on the pre-event voltage;
   compares the polarity of the incident traveling wave to the expected polarity of the traveling wave based on the pre-event voltage; and
   generates a restraining signal when the polarity of the incident traveling wave differs from the expected polarity of the traveling wave based on the pre-event voltage.

4. The system of claim 1, wherein the traveling wave security subsystem further:
   determines a pre-event voltage at the location of the event;
   determines an expected magnitude of the traveling wave based on the pre-event voltage;
   compares the magnitude of the traveling wave to the expected magnitude of the traveling wave based on the pre-event voltage; and
   generates a restraining signal when the magnitude of the traveling wave differs from the expected magnitude of the traveling wave based on the pre-event voltage.

5. The system of claim 1, wherein the traveling wave detection subsystem further:
   identifies an incident wave;
   identifies a first reflection of the incident wave from the location;
   identifies a time difference between the arrival of the incident wave and the first reflection; and
   determines the location based on the time difference and a propagation velocity of the traveling wave.

6. The system of claim 1, wherein the system operates as a supervisory element of a traveling wave distance protection system.

7. The system of claim 2, wherein the predetermined blocking zone corresponds with a location of a switching device, the actuation of which triggers a traveling wave.

8. The system of claim 2, wherein the switching device comprises one of a capacitor in a series-compensated transmission line, and an in-line shunt reactor.

9. The system of claim 2, wherein the traveling wave security subsystem comprises a plurality of comparators to determine whether a time of arrival of the traveling wave is between a first value that corresponds to a near end of the blocking zone and a second value that corresponds to a far end of the blocking zone, and the traveling wave security subsystem generates the restraining signal when the time of arrival of the traveling wave is between the first value and the second value.

10. A method for monitoring traveling waves in an electric power delivery system, comprising:
    acquiring electric power delivery system signals at a first terminal of the electric power delivery system;
    analyzing the electric power delivery system signals to identify two or more traveling waves;
    determining an event location of an event in the electric power delivery system triggering the identified traveling waves;
    assessing a security measure based on the event location;
    selectively generating a restraining signal based on the security measure; and
    implementing a protective action based on detecting the traveling wave and an absence of the restraining signal.

11. The method of claim 10, wherein the security measure comprises a multi-zone protection scheme comprising at least blocking zone.

12. The method of claim 10, further comprising:
    determining a pre-event voltage at the location of the event;

determining an expected polarity of an incident traveling wave based on the pre-event voltage;
comparing the polarity of the incident traveling wave to the expected polarity of the traveling wave based on the pre-event voltage; and
generating a restraining signal when the polarity of the incident traveling wave differs from the expected polarity of the traveling wave based on the pre-event voltage.

13. The method of claim 10, further comprising:
determining a pre-event voltage at the location of the event;
determining an expected magnitude of the traveling wave based on the pre-event voltage; and
comparing the magnitude of the traveling wave to the expected magnitude of the traveling wave based on the pre-event voltage; and
generating a restraining signal when the magnitude of the traveling wave differs from the expected magnitude of the traveling wave based on the pre-event voltage.

14. The method of claim 10, further comprising:
identifying an incident wave,
identifying a first reflection of the incident wave from the location,
identifying a time difference between the arrival of the incident wave and the first reflection, and
determining the location based on the time difference and a propagation velocity of the traveling wave.

15. The method of claim 10, further comprising:
supervising a traveling wave distance protection system using the using the restraining signal.

16. The method of claim 11, wherein the predetermined blocking zone corresponds with a location of a switching device, the actuation of which triggers a traveling wave.

17. The method of claim 11, wherein the switching device comprises one of a capacitor in a series-compensated transmission line, an in-line shunt reactor, a tapped load, and a tapped transformer.

18. The method of claim 11, further comprising:
determining whether a time of arrival of the traveling wave is between a first value that corresponds to a near end of the blocking zone and a second value that corresponds to a far end of the blocking zone; and
generating the restraining signal when the time of arrival is between the first value and the second value.

\* \* \* \* \*